(12) United States Patent
Chang Chien et al.

(10) Patent No.: US 12,532,408 B2
(45) Date of Patent: Jan. 20, 2026

(54) ELECTRONIC DEVICE AND PACKAGE STRUCTURE

(71) Applicant: Advanced Semiconductor Engineering, Inc., Kaohsiung (TW)

(72) Inventors: Chien Lin Chang Chien, Kaohsiung (TW); Yuan-Chun Tai, Kaohsiung (TW); Yu Hsin Chang Chien, Kaohsiung (TW); Chiu-Wen Lee, Kaohsiung (TW); Chang Chi Lee, Kaohsiung (TW)

(73) Assignee: ADVANCED SEMICONDUCTOR ENGINEERING, INC., Kaohsiung (TW)

( * ) Notice: Subject to any disclaimer, the term of this patent is extended or adjusted under 35 U.S.C. 154(b) by 325 days.

(21) Appl. No.: 17/981,338

(22) Filed: Nov. 4, 2022

(65) Prior Publication Data
US 2024/0155758 A1  May 9, 2024

(51) Int. Cl.
| | |
|---|---|
| *H05K 1/02* | (2006.01) |
| *H01F 27/30* | (2006.01) |
| *H01F 27/32* | (2006.01) |
| *H05K 1/11* | (2006.01) |
| *H05K 1/18* | (2006.01) |

(52) U.S. Cl.
CPC .......... *H05K 1/0271* (2013.01); *H01F 27/30* (2013.01); *H01F 27/327* (2013.01); *H05K 1/11* (2013.01); *H05K 1/182* (2013.01); *H05K 2201/068* (2013.01); *H05K 2201/1003* (2013.01)

(58) Field of Classification Search
None
See application file for complete search history.

(56) References Cited

U.S. PATENT DOCUMENTS

| | | | |
|---|---|---|---|
| 8,110,474 B2 | 2/2012 | Carobolante et al. | |
| 2006/0284300 A1* | 12/2006 | Nishizawa | H01L 23/13 257/E23.174 |
| 2007/0230146 A1* | 10/2007 | Suzuki | H05K 1/186 361/760 |
| 2012/0212919 A1* | 8/2012 | Mano | H05K 1/185 174/258 |
| 2018/0031943 A1* | 2/2018 | Yamazaki | G02F 1/1677 |
| 2020/0005989 A1 | 1/2020 | Bharath et al. | |
| 2021/0050273 A1* | 2/2021 | Hsieh | H01L 23/295 |

FOREIGN PATENT DOCUMENTS

WO  WO-2020/106214 A1  5/2020

* cited by examiner

*Primary Examiner* — Wael M Fahmy
*Assistant Examiner* — Nathan W Ha
(74) *Attorney, Agent, or Firm* — FOLEY & LARDNER LLP

(57) ABSTRACT

An electronic device is provided. The electronic device includes a first dielectric layer, an electronic element, an encapsulant, and a second dielectric layer. The first dielectric layer has a first coefficient of thermal expansion (CTE). The electronic element is disposed over the first dielectric layer. The encapsulant encapsulates the electronic element and has a second CTE. The second dielectric layer is disposed over the encapsulant and having a third CTE. The second CTE ranges between the first CTE and the third CTE.

15 Claims, 5 Drawing Sheets

ELECTRONIC DEVICE AND PACKAGE STRUCTURE

BACKGROUND

1. Field of the Disclosure

The present disclosure relates to an electronic device, and in particular to an electronic device including an inductor.

2. Description of the Related Art

In a conventional electronic device, an inductor is disposed over a substrate through a silicon oxide layer. A dry film may be formed on the silicon oxide layer to cover the inductor. During manufacturing processes and/or reliability tests involving multiple cycles of thermal operation, a mismatch of the CTE between the dry film and the silicon oxide layer incurs cracks generated in the dry film. Therefore, a new electronic device is required.

SUMMARY

In some embodiments, an electronic device includes a first dielectric layer, an electronic element, an encapsulant, and a second dielectric layer. The first dielectric layer has a first coefficient of thermal expansion (CTE). The electronic element is disposed over the first dielectric layer. The encapsulant encapsulates the electronic element and has a second CTE. The second dielectric layer is disposed over the encapsulant and having a third CTE. The second CTE ranges between the first CTE and the third CTE.

In some embodiments, an electronic device includes a base, a first dielectric layer, an inductor, and a second dielectric layer. The first dielectric layer is disposed over the base. The inductor is disposed over the first dielectric layer. The second dielectric layer encapsulates the inductor. The second dielectric layer is configured to mitigate the first dielectric layer from being cracked.

In some embodiments, a package structure includes a first electronic unit, a first encapsulant, and a second electronic unit. The first encapsulant encapsulates the first electronic unit. The second electronic unit includes a passive component and a second encapsulant encapsulating the passive component. The first encapsulant has a material the same as that of the second encapsulant.

BRIEF DESCRIPTION OF THE DRAWINGS

Aspects of some embodiments of the present disclosure are readily understood from the following detailed description when read with the accompanying figures. It is noted that various structures may not be drawn to scale, and dimensions of the various structures may be arbitrarily increased or reduced for clarity of discussion.

DETAILED DESCRIPTION

Figure 1:
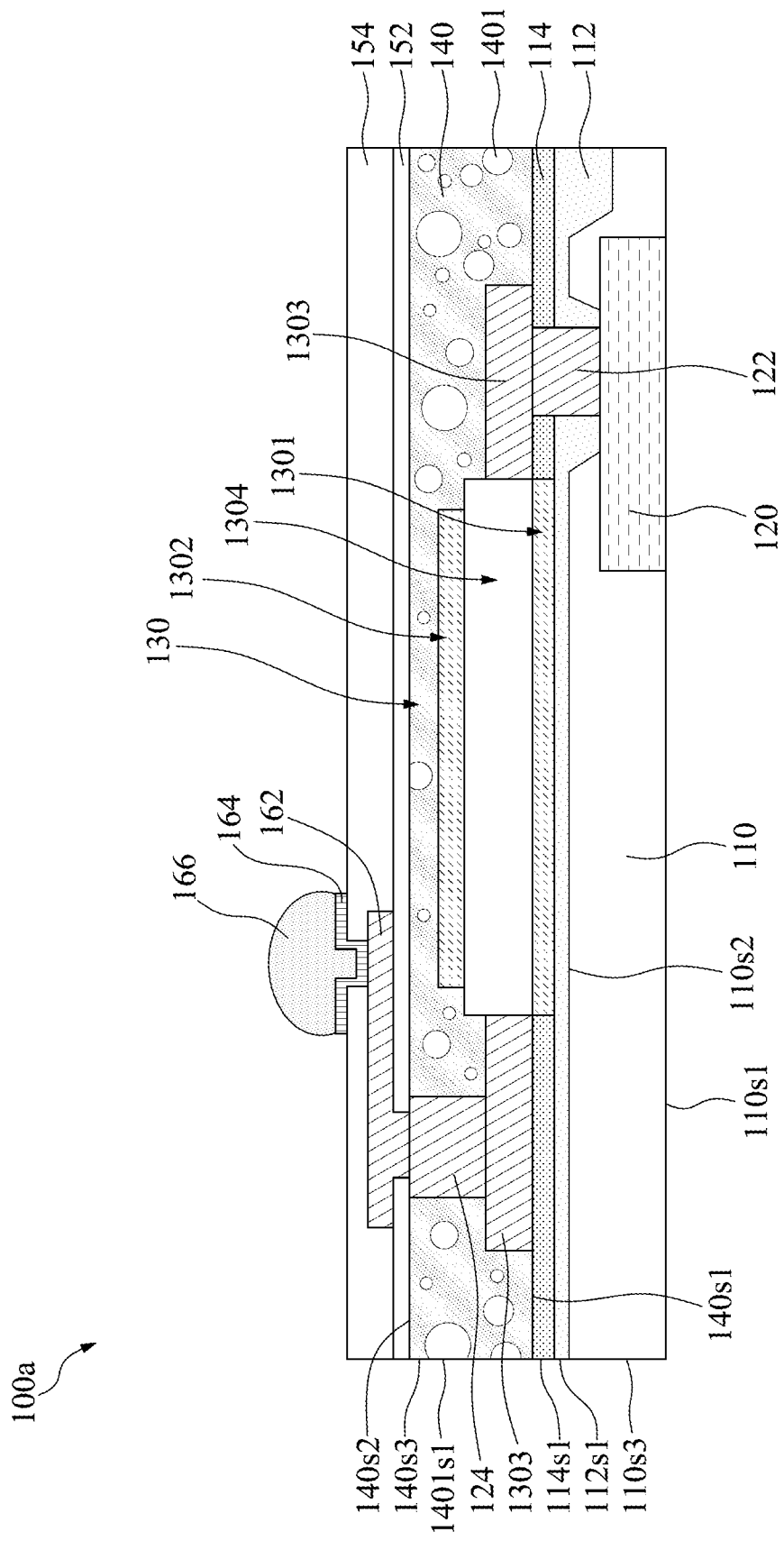
FIG. 1 illustrates a cross-sectional view of an example of an electronic device according to some embodiments of the present disclosure.

Common reference numerals are used throughout the drawings and the detailed description to indicate the same or similar components. Embodiments of the present disclosure will be readily understood from the following detailed description taken in conjunction with the accompanying drawings.

The following disclosure provides many different embodiments, or examples, for implementing different features of the provided subject matter. Specific examples of components and arrangements are described below to explain certain aspects of the present disclosure. These are, of course, merely examples and are not intended to be limiting. For example, the formation of a first feature over or on a second feature in the description that follows may include embodiments in which the first and second features are formed or disposed in direct contact, and may also include embodiments in which additional features may be formed or disposed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

FIG. 1 illustrates a cross-sectional view of an example of an electronic device 100a according to some embodiments of the present disclosure.

In some embodiments, the electronic device 100a may serve as a voltage regulator, and may be applicable to a package structure including an electronic component(s), such as a logic die (e.g., system-on-a-chip (SoC), central processing unit (CPU), graphics processing unit (GPU), application processor (AP), microcontroller, etc.), a memory die (e.g., dynamic random access memory (DRAM) die, static random access memory (SRAM) die, etc.), a power management die (e.g., power management integrated circuit (PMIC) die), a radio frequency (RF) die, a sensor die, a micro-electro-mechanical-system (MEMS) die, a signal processing die (e.g., digital signal processing (DSP) die), a front-end die (e.g., analog front-end (AFE) dies) or other electronic components. In some embodiments, the electronic device 100a may serve as a power management integrated circuit (PMIC), and may be configured to regulate a power of an external electronic component(s).

In some embodiments, the electronic device 100a may include a base 110, an active circuit 120, an electronic element 130, and a dielectric layer 140.

The base 110 (or may be referred to as a carrier or a substrate) may include silicon or germanium or other semiconductor material in a single crystal form, a polycrystalline form, or an amorphous form. The base 110 may include a surface 110s1, a surface 110s2, and a surface 110s3. The surface 110s2 may be opposite to the surface 110s1. The surface 110s3 may extend between the surfaces 110s1 and 110s2. The surface 110s1 may also be referred to as a backside surface. The surface 110s2 may also be referred to an active surface. In this disclosure, the term "active surface" may refer to a surface that may output or transmit a signal, such as a time-varying voltage, current, electromagnetic wave, photon, or other signals.

In some embodiments, the electronic device 100a may further include a dielectric layer 112. The dielectric layer 112 may be disposed on or over the surface 110s2 of the base 110. The dielectric layer 112 may serve as a passivation layer protecting the active circuit 120. The dielectric layer 112 may include dielectric material(s), such as oxides (e.g., silicon oxide), nitrides (e.g., silicon nitride), oxynitrides (e.g., silicon oxynitride), or other suitable materials. The dielectric layer 112 may have a surface 112s1 (or a lateral surface). In some embodiments, the surface 112s1 of the dielectric layer 112 may be aligned with the surface 110s3 of the base 110.

In some embodiments, the electronic device 100a may further include a dielectric layer 114. The dielectric layer 114 may be disposed over the dielectric layer 112. The dielectric layer 114 may be disposed on or over the surface 110s2 of the base 110. The dielectric layer 114 may include dielectric material(s), such as oxides (e.g., silicon oxide), nitrides (e.g., silicon nitride), oxynitrides (e.g., silicon oxynitride), or other suitable materials. In some embodiments, the dielectric layers 112 and 114 may have or be made of the same material, and there is no obvious boundary between the dielectric layers 112 and 114 from a microscope image, such as a scanning electron microscope (SEM) image. The dielectric layer 114 may have a surface 114s1 (or a lateral surface or an external lateral surface). In some embodiments, the surface 114s1 of the dielectric layer 114 may be aligned with the surface 110s3 of the base 110. In some embodiments, the surface 114s1 of the dielectric layer 114 may be aligned with the surface 110s3 of the base 110 and the surface 112s1 of the dielectric layer 112.

In some embodiments, the active circuit 120 may be embedded or at least partially embedded in the base 110. The active circuit 120 may be configured to process or control signal(s). In some embodiments, the active circuit 120 may include an application processor (AP), which may be configured to output a processed signal to an external device (not shown) through the electronic element 130.

In some embodiments, the electronic device 100a may further include a conductive element 122. The conductive element 122 may be disposed on or over the active circuit 120. In some embodiments, the conductive element 122 may penetrate the dielectric layer 112. In some embodiments, the conductive element 122 may penetrate the dielectric layer 114. The conductive element 122 may be configured to electrically connect the active circuit 120 and the electronic element 130. In some embodiments, the conductive element 122 may include a conductive via. The conductive element 122 may include a conductive material(s), such as copper (Cu), aluminum (Al), tungsten (W), titanium (Ti), tantalum (Ta), or other applicable materials.

In some embodiments, the electronic element 130 may be disposed on or over the surface 110s2 of the base 110. The electronic element 130 may be disposed on or over the dielectric layer 114. The electronic element 130 may include a passive component, such as inductor or other suitable passive components. The electronic element 130 may be configured to stabilize the signal(s) received from and/or transmitted to the active circuit 120. The electronic element 130 may be configured to filter the signal(s) received from and/or transmitted to the active circuit 120. In some embodiments, the electronic element 130 may include a thin film inductor (TFI). In some embodiments, the electronic element 130 may include a magnetic material 1301, a magnetic material 1302, a conductive layer 1303, and a passivation layer 1304.

The magnetic material 1301 may be disposed on or over the dielectric layer 114. The magnetic material 1301 may include, one or more magnetic materials. The magnetic materials may include a ferromagnetic material. In some embodiments, the magnetic materials may include at least one of non-metallic magnetic material (e.g., ferrite) and metallic magnetic material. The magnetic materials may include Fe-based amorphous powder, Ni—Zn ferrite, Mn—Zn ferrite or other suitable materials. The Fe-based amorphous powder may be a composite, including Fe and one or more of Si, B, Cr, C or other elements, coated by a dielectric layer, such as $SiO_2$.

In some embodiments, the magnetic material 1302 may be disposed on or over the magnetic material 1301. In some embodiments, the magnetic material 1302 may be at least partially spaced apart from the magnetic material 1301, e.g., by the passivation layer 1304. The material of the magnetic material 1302 may be similar to or the same as that of the magnetic material 1301. In some embodiments, each of the magnetic materials 1301 and 1302 may include a multilayered structure of magnetic films and dielectric films alternatively stacked. The magnetic film may include electrically conductive ferromagnetic materials, such as iron, nickel, nickel-iron alloys, or other suitable materials. The dielectric film may include a non-magnetic dielectric material(s), such as oxides of silicon, aluminum, titanium, tantalum and/or molybdenum, silicon carbide, silicon nitrides, silicon oxynitrides, aluminum nitrides or other suitable materials.

In some embodiments, the conductive layer 1303 may be disposed on or over the dielectric layer 114. In some embodiments, the conductive layer 1303 may be disposed on or over the magnetic material 1301. The conductive layer 1303 may be electrically connected to the conductive element 122. It should be noted that although FIG. 1 illustrates that the conductive layer 1303 has two separated portions disposed at two opposite sides of the passivation layer 1304, the conductive layer 1303 may penetrate the passivation layer 1304 and may be at least partially embedded in the passivation layer 1304 in another cross-sectional view. The conductive layer 1303 may include a conductive material(s), such as Cu, Al, W, Ti, Ta, or other applicable materials.

In some embodiments, the passivation layer 1304 may be disposed on or over the magnetic material 1301. The passivation layer 1304 may include a dielectric material(s). The passivation layer 1304 may include silicon oxide, silicon nitride, silicon oxynitride, or other suitable materials.

It should be noted that although FIG. 1 illustrates that the magnetic material 1302 is completely spaced apart from the magnetic material 1301 by the passivation layer 1304, the passivation layer 1304 may have a hemisphere upper surface, and the magnetic material 1302 may be conformally disposed on the passivation layer 1304 so that the magnetic material 1302 is in contact with the magnetic material 1301 at the edge of the magnetic material 1301 in another cross-sectional view.

In some embodiments, the dielectric layer 114, the electronic element 130, the active circuit 120, and the base 110 may jointly constitute or define a die.

In some embodiments, the dielectric layer 140 (or an encapsulant layer) may be disposed on or over the surface 110s2 of the base 110. In some embodiments, the dielectric layer 140 may be disposed on or over the dielectric layer 114. In some embodiments, the dielectric layer 140 may be disposed on or over the dielectric layer 112. In some embodiments, the dielectric layer 140 may be in contact with the dielectric layer 114. In some embodiments, the dielectric layer 140 may cover the electronic element 130. In some embodiments, the dielectric layer 140 may be configured to reduce the warpage of the electronic devices 100a. In some embodiments, the dielectric layer 140 may be configured to reduce thermal stress generated between the dielectric layers 140 and 114. In some embodiments, the dielectric layer 140 may be configured to mitigate the dielectric layer 114 from being cracked. In some embodiments, the dielectric layer 140 may have a coefficient of thermal expansion (CTE) of 40 ppm/° C. or lower, such as 40 ppm/° C., 35 ppm/° C., 30 ppm/° C., 25 ppm/° C., 20 ppm/° C., 15 ppm/° C., 10 ppm/° C., 5 ppm/° C. or 3 ppm/° C. The dielectric layers 140 and 114 may have a relatively small difference of CTE. In some embodiments, the difference of CTE between the dielectric layers 140 and 114 is 40 ppm/° C. or lower, 30 ppm/° C. or lower, 20 ppm/° C. or lower, or 10 ppm/° C. or lower. In some embodiments, the difference of CTE between the dielectric layers 140 and 114 may range from about 0.5 ppm/° C. to about 40 ppm/° C., such as 0.5 ppm/° C., 1 ppm/° C., 2 ppm/° C., 5 ppm/° C., 10 ppm/° C., 15 ppm/° C., 20 ppm/° C., 30 ppm/° C., or 40 ppm/° C. When the CTE of the dielectric layer 140 is equal to 40 ppm/° C. or lower or the difference of CTE between the dielectric layers 140 and 114 is 40 ppm/° C. or lower, the thermal stress between the dielectric layers 140 and 114 may be relatively small, which thereby prevents from a crack(s) generated between the dielectric layers 140 and 114 during manufacturing processes or a reliability test (e.g., a thermal cycling test) at a relatively high temperature or an operation of multiple cycles of heating. The material of the dielectric layer 140 may be selected, depending on the CTE of the dielectric layer 114, so that the CTE of the dielectric layer 140 is equal to 40 ppm/° C. or lower or the difference of CTE between the dielectric layers 140 and 114 is 40 ppm/° C. or lower.

In some embodiments, the dielectric layer 140 may include a monolithic structure. That is, the dielectric layer 140 may be a single-layered structure, which is formed by one cycle of manufacturing processes. In some embodiments, the dielectric layer 140 is integrally-formed. In some embodiments, the dielectric layer 140 may include an inorganic material. In some embodiments, the dielectric layer 140 may include a molding compound, which may be formed by compression molding, injection molding, transfer molding, or other suitable techniques. In some embodiments, the dielectric layer 140 may include an epoxy resin-based material, which may include bis-epoxides, poly-epoxides, and/or other epoxy resin compositions. It has been found that in some embodiments where the dielectric layer 140 includes a molding compound, the difference of CTE between the dielectric layers 140 and 114 can be further reduced, for example, to be 20 ppm/° C. or lower or 10 ppm/° C. or lower, and as a result, the crack(s) resulted from thermal stress can be reduced; in addition, the warpage of the electronic device 100a can be reduced.

The dielectric layer 140 may have a surface 140$s1$, a surface 140$s2$, and a surface 140$s3$. The surface 140$s1$ may face the base 110. The surface 140$s2$ may be opposite to the surface 140$s1$. The surface 140$s3$ may extend between the surfaces 140$s1$ and 140$s2$. In some embodiments, the surface 140$s3$ of the dielectric layer 140 may be aligned with the surface 110$s3$ of the base 110. In some embodiments, the surface 140$s3$ of the dielectric layer 140 may be aligned with the surface 112$s1$ of the dielectric layer 112 and/or the surface 114$s1$ of the dielectric layer 114.

In some embodiments, the dielectric layer 140 may include fillers 1401. The filler 1401 may have the same or different sizes. The fillers 1401 may surround the electronic element 130. A portion of the fillers 1401 may laterally overlap the electronic element 130 (e.g., from a side view perspective). A portion of the fillers 1401 may vertically overlap the electronic element 130 (e.g., from a top view perspective). The composition of the fillers 1401 in the dielectric layer 140 may be equal to or greater than about 60%, such as 60%, 70%, 80%, 90%, or 95% by mass. Some of the fillers 1401 may have a surface 1401$s1$ (or a truncated surface or a side), which may be generated by performing a grinding technique, a dicing technique, a laser drilling technique, an etching technique, or other suitable techniques on the dielectric layer 140. In some embodiments, the surface 1401$s1$ of the filler 1401 may be aligned with the surface 140$s3$ of the dielectric layer 140. In some embodiments, the surface 1401$s1$ of the filler 1401 may be aligned with the surface 112$s1$ of the dielectric layer 112 and/or the surface 114$s1$ of the dielectric layer 114. In some embodiments, the surface 1401$s1$ of the filler 1401 may be exposed from the surface 140$s3$ of the dielectric layer 140. The filler 1401 may include, for example, organic fillers or inorganic fillers (e.g., silica filler) or other suitable materials. The filler 1401 may enhance a modulus (e.g., shear modulus or modulus of rigidity) of the dielectric layer 140, which thereby reduces the warpage of the electronic device 100a. In some embodiments, the modulus (e.g., shear modulus or modulus of rigidity) of the dielectric layer 140 may be greater than that of the dielectric layer 114.

In some embodiments, the electronic device 100a may further include a conductive element 124. The conductive element 124 may be disposed on or over the conductive layer 1303 of the electronic element 130. The conductive element 124 may be electrically connected to the conductive layer 1303 of the electronic element 130. In some embodiments, the conductive element 124 may include a conductive via or a conductive pillar. In some embodiments, the conductive element 124 may at least partially penetrate the dielectric layer 140.

In some embodiments, the electronic device 100a may further include dielectric layers 152 and 154. The dielectric layer 152 may be disposed on or over the surface 140$s2$ of the dielectric layer 140. In some embodiments, the dielectric layer 152 may be in contact with the dielectric layer 140. The dielectric layer 154 may be disposed on or over the dielectric layer 152. Each of the dielectric layers 152 and 154 may include a dielectric material(s), such as polyamide, polyimide, or other suitable materials. In some embodiments, the CTE of the dielectric layer 140 may range between the CTE of the dielectric layer 114 and the CTE of the dielectric layer 152.

In some embodiments, the electronic device 100a may further include a conductive element 162, a conductive element 164, and an electrical connection 166. The conductive element 162 may include a conductive trace or pad (not annotated) disposed on the dielectric layer 152 and a conductive via (not annotated) penetrating the dielectric layer 152. The conductive element 162 may be electrically connected to the conductive element 124. The conductive element 162 may be electrically connected to the electronic element 130. The conductive element 164 may be disposed between the conductive element 162 and the electrical connection 166. The conductive element 164 may function as an under bump metallization (UBM). The electrical connection 166 may be configured to be electrically connected to an external device (not shown). The electrical connection 166 may include one or more conductive materials such as metals or alloys, e.g., alloys of gold and tin solder or alloys of silver and tin solder.

In a comparative electronic device, a polymer-based material, such as a polyimide, Ajinomoto Build-up Film (ABF), is utilized to protect a TFI. However, the polymer-based material films may be formed by performing multiple coating processes to ensure that the polymer-based material films have a sufficient thickness to cover the TFI, which increases the cost and has a negative influence on mass-production. In another comparative electronic device, a dry film, is utilized to protect the TFI. However, the CTE of the dry film ranges from about 50 ppm/° C. to about 60 ppm/° C. so that the dry film and the dielectric layer (e.g., silicon oxide which has CTE of about 7.1 ppm/° C.) under the TFI have a relatively great difference of CTE. In this condition, crack(s) may be formed between the dry film and the dielectric layer during manufacturing processes and/or reliability tests, which involves an operation at a relatively high temperature or an operation of multiple cycles of heating. Unlike comparative electronic devices, the electronic device 100*a* utilizes the dielectric layer 140 to protect the electronic element 130. The dielectric layer 140 has a CTE in a range between the CTE of the dielectric layer 114 and the CTE of the dielectric layer 152 or has a relatively small CTE (e.g., 40 ppm/° C. or lower) so that the difference in the CTEs of the dielectric layers 140 and 114 can be reduced. In this condition, the thermal stress is relatively small when a thermal operation is performed, which may reduce cracks formed during manufacturing processes and/or reliability tests.

Figure 2:
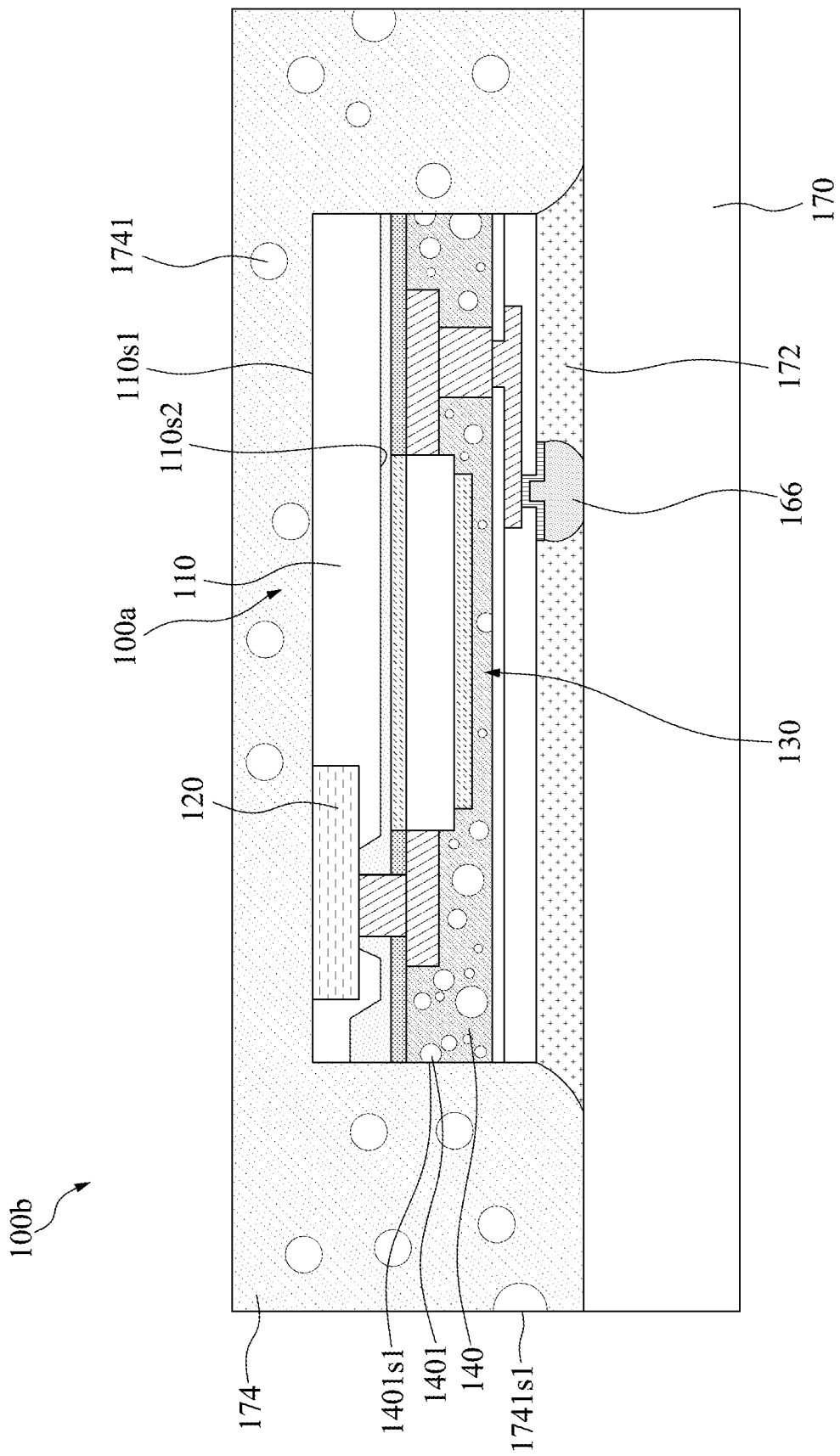
FIG. 2 illustrates a cross-sectional view of an example of a package structure according to some embodiments of the present disclosure.

FIG. 2 illustrates a cross-sectional view of an example of a package structure 100*b* according to some embodiments of the present disclosure. In some embodiments, the package structure 100*b* may include at least one electronic device 100*a* (or may be referred to as an electronic unit), a substrate 170, an underfill 172, and an encapsulant 174.

The substrate 170 (or may be referred to as a carrier) may include a silicon, germanium, or other suitable materials. The electronic device 100*a* may be disposed on or over the substrate 170. The surface 110*s*2 of the base 110 may face the substrate 170. The substrate 170 may include active elements and/or passive elements, which may be electrically connected to the electronic element 130 through the electrical connection 166.

In some embodiments, the underfill 172 may be formed on the substrate 170. The underfill 172 may encapsulate the electrical connection 166. The underfill 172 may include a capillary underfill (CUF).

In some embodiments, the encapsulant 174 may be disposed on or over the substrate 170. In some embodiments, the encapsulant 174 may encapsulate the electronic device 100*a*. In some embodiments, the encapsulant 174 may covers the surface 110*s*1 of the base 110. In some embodiments, the encapsulant 174 may be in contact with the dielectric layer 140. In some embodiments, the surface 1401*s*1 of the filler 1401 may be in contact with the encapsulant 174. The encapsulant 174 may include a Novolac-based resin, an epoxy-based resin, a silicone-based resin, or another suitable material. In some embodiments, the encapsulant 174 may include fillers 1741. The filler 1741 may include organic fillers or inorganic fillers (e.g., silica filler) or other suitable materials. In some embodiments, the encapsulant 174 and the dielectric layer 140 may include or be made of the same material. In some embodiments, the average dimension (e.g., diameter) of the fillers 1741 may be different from that of the fillers 1401. Some of the fillers 1741 may have a surface 1741*s*1 (or a truncated surface or a side), which may be generated by performing a grinding technique, a dicing technique, a laser drilling technique, an etching technique, or other suitable techniques on the encapsulant 174.

Figure 3:
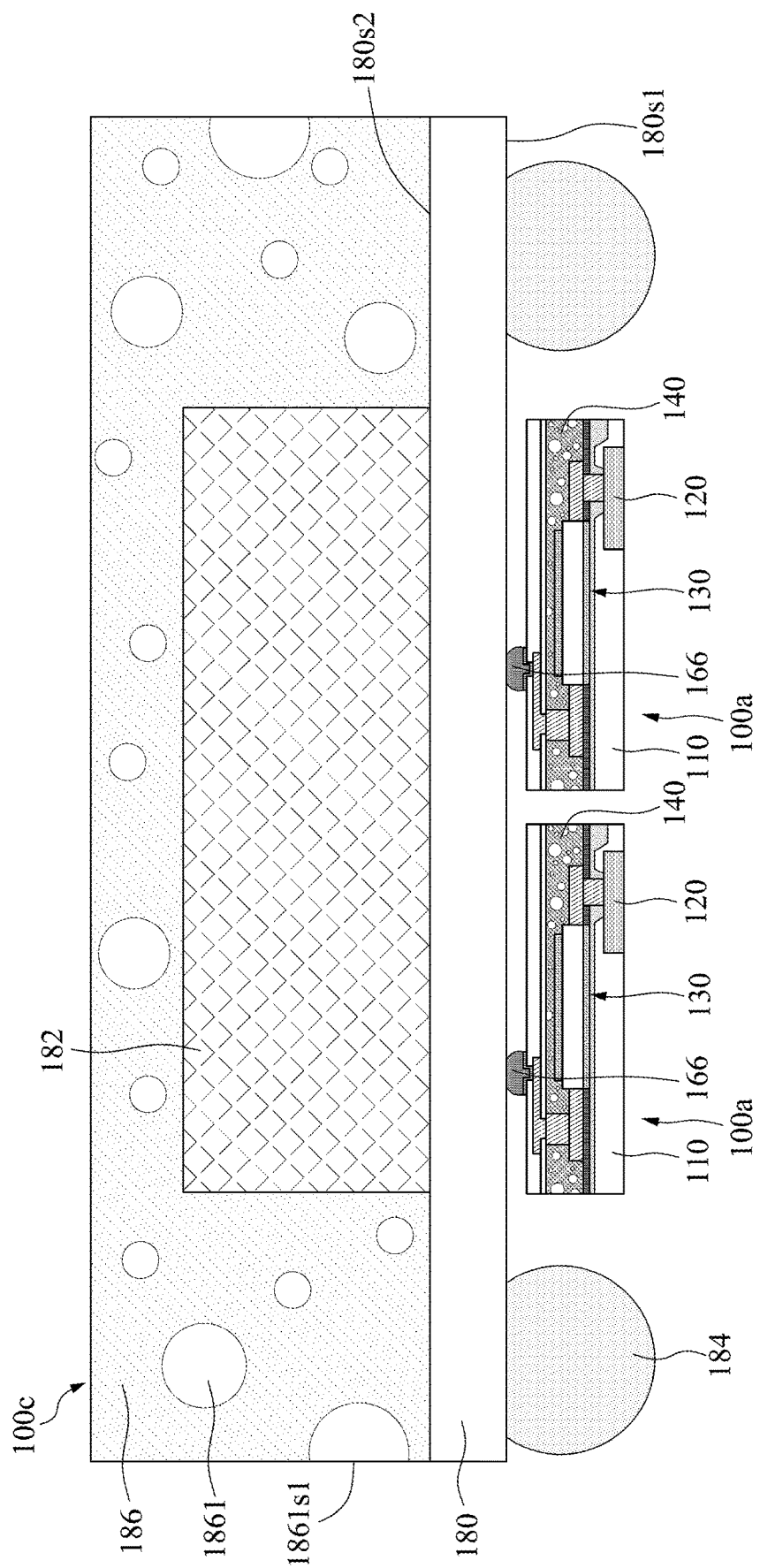
FIG. 3 illustrates a cross-sectional view of an example of a package structure according to some embodiments of the present disclosure.

FIG. 3 illustrates a cross-sectional view of an example of a package structure 100*c* according to some embodiments of the present disclosure. In some embodiments, the package structure 100*c* may include an electronic device(s) 100*a* (or may be referred to as an electronic unit), a substrate 180, an electronic component 182, electrical connections 184, and an encapsulant 186.

In some embodiments, the substrate 180 (or may be referred to as a carrier) may include a redistribution structure, which may include multiple dielectric layers and metal layers and vias. In some embodiments, the substrate 180 may include a silicon, germanium, or other suitable materials. The substrate 180 may include a surface 180*s*1 and a surface 180*s*2 opposite to the surface 180*s*1. In some embodiments, the electronic device 100*a* may be disposed on the surface 180*s*1 of the substrate 180. In some embodiments, the electronic device 100*a* may be electrically connected to the substrate 180 through the electrical connection 166.

In some embodiments, the electronic component 182 (or may be referred to as an electronic unit) may be disposed on the surface 180*s*2 of the substrate 180. In some embodiments, the electronic component 182 may be electrically connected to or signally coupled to the electronic device 100*a* through the substrate 180. The electronic component 182 may include active components and/or passive components. The active component may include a semiconductor die or a chip, such as a logic die (e.g., system-on-a-chip (SoC), central processing unit (CPU), graphics processing unit (GPU), application processor (AP), microcontroller, etc.), a memory die (e.g., dynamic random access memory (DRAM) die, static random access memory (SRAM) die, etc.), a power management die (e.g., power management integrated circuit (PMIC) die), a radio frequency (RF) die, a sensor die, a micro-electro-mechanical-system (MEMS) die, a signal processing die (e.g., digital signal processing (DSP) die), a front-end die (e.g., analog front-end (AFE) dies) or other active components. The passive component may include a capacitor, a resistor, an inductor or other passive components.

In some embodiments, the electrical connection 184 may be disposed on the surface 180*s*1 of the substrate 180. The electrical connections 184 may surround the electronic device 100*a*. The electrical connection 184 may be configured to be electrically connected to an external device (not shown). The electrical connection 184 may include one or more materials such as alloys of gold and tin solder or alloys of silver and tin solder. In some embodiments, the electrical connection 184 may be configured to receive an external power. The external power may be transmitted to the electronic element 100*a*. The electronic element 100*a* may function as a PMIC which regulates the external power and transmits the external power to the electronic component 182. In some embodiments, the electronic element 100*a* may vertically overlap the electronic component 182 (e.g., from a top view perspective), which thereby reduces a signal transmission path(s) (e.g., a power path(s)).

In some embodiments, the encapsulant 186 may be disposed on or over the surface 180*s*2 of the substrate 180. In some embodiments, the encapsulant 186 may encapsulate the electronic component 182. The encapsulant 186 may include a Novolac-based resin, an epoxy-based resin, a silicone-based resin, or another suitable material. In some embodiments, the encapsulant 186 may include fillers 1861. In some embodiments, the fillers 1861 may surround the electronic component 182. The filler 1861 may include organic fillers or inorganic fillers (e.g., silica filler) or other suitable materials. In some embodiments, the encapsulant 186 and the dielectric layer 140 may include or be made of the same material. Some of the fillers 1861 may have a surface 1861s1 (or a truncated surface or a side) exposed from a lateral surface (not annotated) of the encapsulant 186, which may be generated by performing a grinding technique, a dicing technique, a laser drilling technique, an etching technique, or other suitable techniques on the encapsulant 186.

Figure 4A:
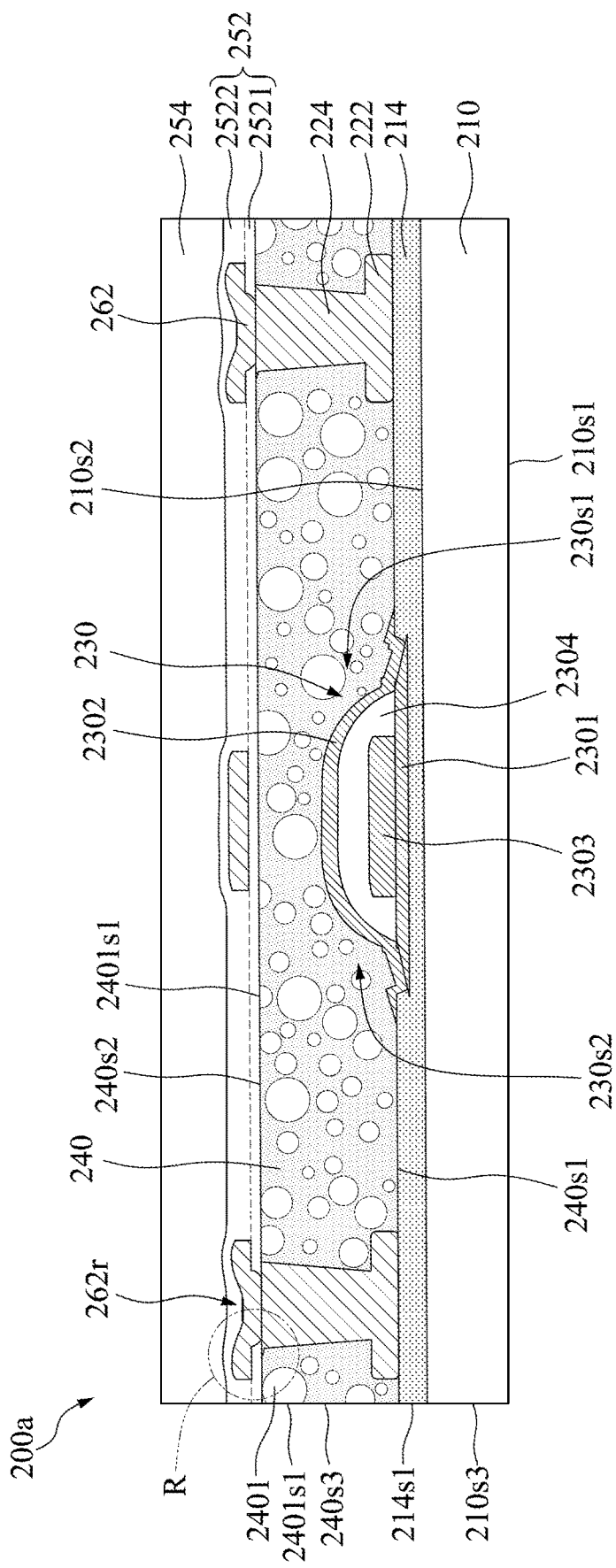
FIG. 4A illustrates a cross-sectional view of an example of an electronic device according to some embodiments of the present disclosure.

FIG. 4A illustrates a cross-sectional view of an example of an electronic device 200a according to some embodiments of the present disclosure. In some embodiments, the electronic device 100a shown in FIG. 2 and FIG. 3 may be replaced by the electronic device 200a.

In some embodiments, the electronic device 200a may include a base 210, a dielectric layer 214, an electronic element 230, and a dielectric layer 240.

The base 210 (or may be referred to as a carrier or a substrate) may include silicon or germanium or other semiconductor material in a single crystal form, a polycrystalline form, or an amorphous form. The base 210 may include a surface 210s1, a surface 210s2, and a surface 210s3. The surface 210s2 may be opposite to the surface 210s1. The surface 210s3 may extend between the surfaces 210s1 and 210s2. The surface 210s1 may also be referred to as a backside surface. The surface 210s2 may also be referred to an active surface. Some active circuits (e.g., an application processor or other suitable integrated circuits) may be embedded within the base 210.

In some embodiments, the electronic device 200a may further include a dielectric layer 214. The dielectric layer 214 may be disposed over the base 210. The dielectric layer 214 may include dielectric material(s), such as oxides (e.g., silicon oxide), nitrides (e.g., silicon nitride), oxynitrides (e.g., silicon oxynitride), or other suitable materials. The dielectric layer 214 may have a surface 214s1. In some embodiments, the surface 214s1 of the dielectric layer 214 may be aligned with the surface 210s3 of the base 210. In some embodiments, the surface 214s1 of the dielectric layer 214 may be aligned with the surface 210s3 of the base 210.

In some embodiments, the electronic element 230 may be disposed on or over the surface 210s2 of the base 210. The electronic element 230 may be disposed on or over a recess (not annotated) defined by the dielectric layer 214. The electronic element 230 may include a passive component, such as inductor or other suitable passive components. In some embodiments, the electronic element 230 may include a TFI. The electronic element 230 may be electrically connected to the active circuits within the base 210. The electronic element 230 may have a side 230s1 and a side 230s2 opposite to the side 230s1. In some embodiments, the electronic element 230 may include a magnetic material 2301, a magnetic material 2302, a conductive layer 2303, and a passivation layer 2304.

In some embodiments, the magnetic material 2301 may be disposed on or over the dielectric layer 214. In some embodiments, the magnetic material 2301 may be partially embedded in the dielectric layer 214. In some embodiments, the magnetic material 2302 may be disposed on or over the magnetic material 2301. In some embodiments, the material and structure of the magnetic materials 2301 and 2302 may be similar to those of the magnetic materials 1301 and 1302, respectively.

In some embodiments, the conductive layer 2303 may be disposed on or over the dielectric layer 214. In some embodiments, the conductive layer 2303 may be disposed on or over the magnetic material 2301. The conductive layer 2303 may include a conductive material(s), such as Cu, Al, W, Ti, Ta, or other applicable materials.

In some embodiments, the passivation layer 2304 may be disposed on or over the magnetic material 2301. The passivation layer 2304 may be disposed between the magnetic materials 2301 and 2302. The passivation layer 2304 may be encapsulated by the magnetic materials 2301 and 2302. The passivation layer 2304 may cover the conductive layer 2303. The passivation layer 2304 may include a dielectric material(s). The passivation layer 2304 may include silicon oxide, silicon nitride, silicon oxynitride, or other suitable materials.

In some embodiments, the dielectric layer 240 (or an encapsulant layer) may be disposed on or over the surface 210s2 of the base 210. In some embodiments, the dielectric layer 240 may be disposed on or over the dielectric layer 214. In some embodiments, the dielectric layer 240 may be in contact with the dielectric layer 214. In some embodiments, the dielectric layer 240 may cover the electronic element 230. In some embodiments, the dielectric layer 240 may be configured to reduce the warpage of the electronic devices 200a. In some embodiments, the dielectric layer 240 may be configured to reduce the thermal stress generated during manufacturing processes or reliability tests (e.g., a thermal cycling test). In some embodiments, the material of the dielectric layer 240 may be the same as or similar to that of the dielectric layer 140. The dielectric layer 240 may have a surface 240s1, a surface 240s2, and a surface 240s3. The surface 240s1 may face the base 210. The surface 240s2 may be opposite to the surface 240s1. The surface 240s3 may extend between the surfaces 240s1 and 240s2. In some embodiments, the surface 240s3 of the dielectric layer 240 may be aligned with the surface 210s3 of the base 210.

In some embodiments, the dielectric layer 240 may include fillers 2401. In some embodiments, the fillers 2401 may surround the electronic element 230. In some embodiments, the fillers 2401 may be located adjacent to at least two opposite sides 230s1 and 230s2 of the electronic element 230. The fillers 2401 may be disposed over the upper surface (not annotated) of the magnetic material 2302. The fillers 2401 may have the same or different sizes. The composition of the filler 2401 in the dielectric layer 240 may be equal to or greater than about 60%, such as 60%, 70%, 80%, 90%, or 95% by mass. Some of the filler 2401 may have a surface 2401s1 (or a truncated surface or a side), which may be generated by performing a grinding technique, a dicing technique, a laser drilling technique, an etching technique, or other suitable techniques on the dielectric layer 240. In some embodiments, the surface 2401s1 of the filler 2401 may be aligned with the surface 240s3 of the dielectric layer 240. In some embodiments, the surface 2401s1 of the filler 2401 may be exposed from the surface 240s3 of the dielectric layer 240. In some embodiments, the surface 2401s1 of the filler 2401 may be exposed from the surface 240s2 of the dielectric layer 240. The material of the filler 2401 may be the same as or similar to that of the filler 1401.

In some embodiments, the electronic device 200a may further include a conductive element 222 and a conductive element 224. The conductive element 222 may be disposed on the base 210. The conductive element 222 may include, for example, a conductive pad and/or a metal trace. In some embodiment, the conductive element 222 may be electrically connected to the conductive layer 2303 of the electronic element 230.

The conductive element 224 may be disposed on the conductive element 222. The conductive element 224 may penetrate the dielectric layer 240. The conductive element 224 may include, for example, a conductive via and/or a conductive pillar. The conductive elements 222 and 224 may be configured to electrically connect the electronic element 230 and other electronic components (not shown). In some embodiments, the conductive element 224 may be tapered toward the base 210. In some embodiments, an upper portion (not annotated) of the conductive element 224 has a dimension (e.g., width or diameter) greater than that of a lower portion (not annotated) of the conductive element 224.

In some embodiments, the electronic device 200a may further include dielectric layers 252 and 254. The dielectric layer 252 may be disposed on or over the surface 240s2 of the dielectric layer 240. The dielectric layer 254 may be disposed on the dielectric layer 252. The material of the dielectric layers 252 and 254 may be the same as or similar to that of the dielectric layers 152 and 154, respectively. In some embodiments, the dielectric layer 252 may include multiple layers, such as layers 2521 and 2522. The layer 2521 may be configured to define a via opening, and the layer 2522 may cover the conductive element 262. In some embodiments, the layer 2522 can be a part of the dielectric layer 254; that is, the electronic device 200a may include a dielectric layer 2521 defining a via opening and a dielectric layer 254 (including the layer 2522) covering the conductive element 262, where the dielectric layer 254 and the layer 2522 may be formed-integrally as a monolithic structure.

In some embodiments, the electronic device 200a may further include a conductive element 262. The conductive element 262 may be disposed on the conductive element 224. The conductive element 262 may be electrically connected to the conductive element 224. The conductive element 262 may be electrically connected to the electronic element 230. In some embodiments, the conductive element 262 may be configured to electrically connect the electronic element 230 and an electrical connection, such as a solder ball (not shown). The conductive element 262 may include a conducive layer. In some embodiments, the conductive element 262 may function as a UBM. In some embodiments, the conductive element 262 may define a recess 262r over the conductive element 224.

Figure 4B:
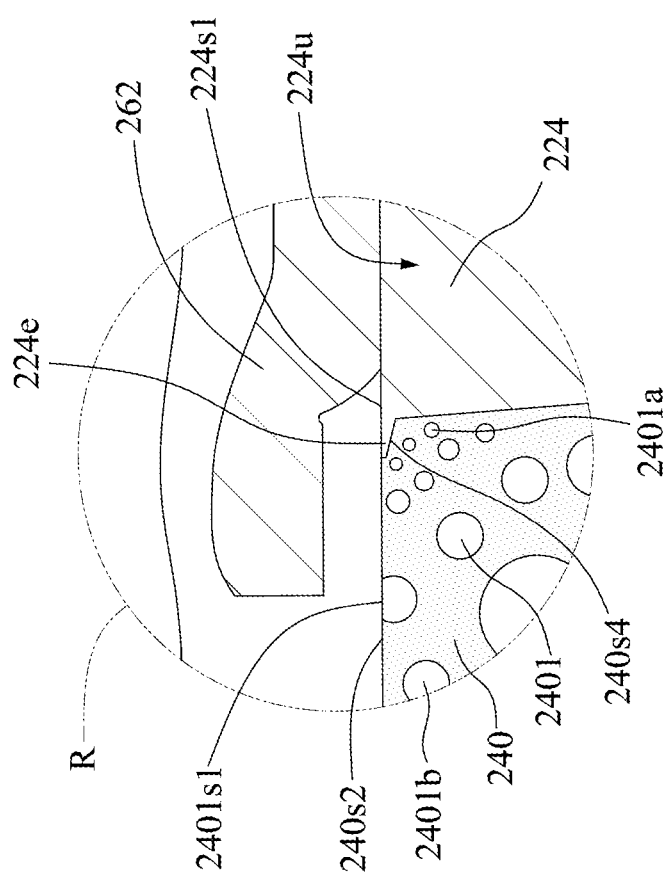
FIG. 4B is a partial enlarged view of the electronic device as shown in FIG. 4A.

FIG. 4B is a partial enlarged view of region R of the electronic device 200a as shown in FIG. 4A. In some embodiments, the dielectric layer 240 may have a surface 240s4 (or an upper surface) recessed from the surface 240s2. In some embodiments, the surface 240s4 may be slanted with respect to the surface 240s2.

In some embodiments, the conductive element 224 may include a lower portion (not annotated) and an upper portion 224u. In some embodiments, the upper portion 224u of the conductive element 224 may laterally extends into the dielectric layer 240. In some embodiments, the conductive element 224u may include an extending portion 224e. The extending portion 224e may laterally extends into the dielectric layer 240. The extending portion 224e may cover the surface 240s4 of the dielectric layer 240.

In some embodiments, after the formation of the dielectric layer 240 covering the electronic element 230 and the conductive element 222, the conductive element 224 may be formed by (1) forming a via opening within the dielectric layer 240 by, for example, laser drilling technique or other suitable techniques, to expose an upper surface of the conductive element 222 and then (2) filling a conductive material into the via opening, for example, by an electroplating technique or other suitable techniques, to form the conductive element. A grinding technique may be performed after the dielectric layer 240 is formed so as to expose a surface 224s1 (or an upper surface) of the conductive element 224, and the extending portion 224e of the conductive element 224 may be produced during grinding. The extending portion 224e of the conductive element 224 may extend laterally into the dielectric layer 240 and cover a portion of the fillers 2401.

As shown in FIG. 4B, the surface 2401s 1 of the filler 2401 may be aligned with the surface 224s1 of the conductive element 224. The fillers 2401 may surround the conductive element 242. The fillers 2401 may have different sizes. In some embodiments, the filler 2401 closer to the conductive element 224 may have a smaller size (e.g., width or diameter) than that of the fillers 2401 far away from the conductive element 224. For example, the fillers 2401 may include particles 2401a and 2401b. The particle 2401a is closer to the conductive element 224 than the particle 2401b is. The size of the particle 2401b may be greater than that of the particle 2401a.

In this embodiment, the electronic device 200a utilizes the dielectric layer 240 to protect the electronic element 230. The dielectric layer 240 has a relatively small CTE (e.g., 40 ppm/° C. or lower) so that the dielectric layer 240 and the dielectric layer 214 have a relatively small difference of CTE. In this condition, the thermal stress is relatively small when a thermal operation is performed, which may reduce cracks formed during manufacturing processes and/or reliability tests.

Spatial descriptions, such as "above," "below," "up," "left," "right," "down," "top," "bottom," "vertical," "horizontal," "side," "higher," "lower," "upper," "over," "under," and so forth, are indicated with respect to the orientation shown in the figures unless otherwise specified. It should be understood that the spatial descriptions used herein are for purposes of illustration only, and that practical implementations of the structures described herein can be spatially arranged in any orientation or manner, provided that the merits of embodiments of this disclosure are not deviated from by such an arrangement.

As used herein, the terms "approximately," "substantially," "substantial" and "about" are used to describe and account for small variations. When used in conjunction with an event or circumstance, the terms can refer to instances in which the event or circumstance occurs precisely as well as instances in which the event or circumstance occurs to a close approximation. For example, when used in conjunction with a numerical value, the terms can refer to a range of variation less than or equal to ±10% of that numerical value, such as less than or equal to ±5%, less than or equal to ±4%, less than or equal to ±3%, less than or equal to ±2%, less than or equal to ±1%, less than or equal to ±0.5%, less than or equal to ±0.1%, or less than or equal to ±0.05%. For example, two numerical values can be deemed to be "substantially" the same or equal if a difference between the values is less than or equal to ±10% of an average of the values, such as less than or equal to ±5%, less than or equal to ±4%, less than or equal to ±3%, less than or equal to ±2%, less than or equal to ±1%, less than or equal to ±0.5%, less than or equal to ±0.1%, or less than or equal to ±0.05%.

Two surfaces can be deemed to be coplanar or substantially coplanar if a displacement between the two surfaces is no greater than 5 μm, no greater than 2 μm, no greater than 1 μm, or no greater than 0.5 μm.

As used herein, the singular terms "a," "an," and "the" may include plural referents unless the context clearly dictates otherwise.

As used herein, the terms "conductive," "electrically conductive" and "electrical conductivity" refer to an ability to transport an electric current. Electrically conductive materials typically indicate those materials that exhibit little or no opposition to the flow of an electric current. One measure of electrical conductivity is Siemens per meter (S/m). Typically, an electrically conductive material is one having a conductivity greater than approximately $10^4$ S/m, such as at least $10^5$ S/m or at least $10^6$ S/m. The electrical conductivity of a material can sometimes vary with temperature. Unless otherwise specified, the electrical conductivity of a material is measured at room temperature.

Additionally, amounts, ratios, and other numerical values are sometimes presented herein in a range format. It is to be understood that such range format is used for convenience and brevity and should be understood flexibly to include numerical values explicitly specified as limits of a range, but also to include all individual numerical values or sub-ranges encompassed within that range as if each numerical value and sub-range is explicitly specified.

While the present disclosure has been described and illustrated with reference to specific embodiments thereof, these descriptions and illustrations are not limiting. It should be understood by those skilled in the art that various changes may be made and equivalents may be substituted without departing from the true spirit and scope of the present disclosure as defined by the appended claims. The illustrations may not be necessarily drawn to scale. There may be distinctions between the artistic renditions in the present disclosure and the actual apparatus due to manufacturing processes and tolerances. There may be other embodiments of the present disclosure which are not specifically illustrated. The specification and drawings are to be regarded as illustrative rather than restrictive. Modifications may be made to adapt a particular situation, material, composition of matter, method, or process to the objective, spirit and scope of the present disclosure. All such modifications are intended to be within the scope of the claims appended hereto. While the methods disclosed herein have been described with reference to particular operations performed in a particular order, it will be understood that these operations may be combined, sub-divided, or re-ordered to form an equivalent method without departing from the teachings of the present disclosure. Accordingly, unless specifically indicated herein, the order and grouping of the operations are not limitations of the present disclosure.

What is claimed is:

1. An electronic device, comprising:
    a first dielectric layer having a first coefficient of thermal expansion (CTE);
    an electronic element disposed over the first dielectric layer;
    an encapsulant encapsulating the electronic element and having a second CTE;
    a second dielectric layer disposed over the encapsulant and having a third CTE,
    wherein the second CTE ranges between the first CTE and the third CTE; and
    a conductive pillar electrically connected to the electronic element and passing through the encapsulant, wherein the encapsulant comprises fillers around the conductive pillar.

2. The electronic device of claim 1, further comprising:
    a base with an active circuit, wherein the first dielectric layer is disposed over the base, and wherein the first dielectric layer, the electronic element, and the base collectively constitute a die.

3. The electronic device of claim 2, wherein the fillers are disposed around the electronic element.

4. The electronic device of claim 3, wherein a portion of the fillers overlaps the electronic element.

5. The electronic device of claim 2, wherein a portion of the fillers has a surface substantially aligned with a side surface of the base.

6. The electronic device of claim 2, wherein the at least one of the fillers has a side surface substantially aligned with an external lateral surface of the first dielectric layer.

7. The electronic device of claim 1, wherein the electronic element comprises an inductor.

8. The electronic device of claim 7, wherein the electronic element comprises:
    a conductive layer;
    a passivation layer encapsulating the conductive layer; and
    a magnetic material encapsulating the passivation layer.

9. The electronic device of claim 1, wherein at least one of the fillers has a surface substantially level with a top surface of the conductive pillar.

10. An electronic device, comprising:
    a first dielectric layer having a first coefficient of thermal expansion (CTE);
    an electronic element disposed over the first dielectric layer;
    an encapsulant encapsulating the electronic element and having a second CTE;
    a second dielectric layer disposed over the encapsulant and having a third CTE,
    wherein the second CTE ranges between the first CTE and the third CTE; and
    a conductive pillar electrically connected to the electronic element and passing through the encapsulant; and
    a conductive layer disposed over the conductive pillar and exposing a portion of an upper surface of the conducive pillar.

11. The electronic device of claim 10, wherein the conductive layer has a recess over the conductive pillar.

12. The electronic device of claim 10, further comprising:
    a third dielectric layer disposed over the second dielectric layer and encapsulating the conductive layer, wherein a thickness of third dielectric layer is greater than a thickness of the second dielectric layer.

13. An electronic device, comprising:
    a first dielectric layer having a first coefficient of thermal expansion (CTE);
    an electronic element disposed over the first dielectric layer;
    an encapsulant encapsulating the electronic element and having a second CTE;
    a second dielectric layer disposed over the encapsulant and having a third CTE,
    wherein the second CTE ranges between the first CTE and the third CTE; and
    a conductive pillar electrically connected to the electronic element and passing through the encapsulant, wherein the conductive pillar has an upper portion laterally extended into the encapsulant.

14. The electronic device of claim 13, further comprising:
    a plurality of fillers within the encapsulant, wherein a first one of the plurality of fillers has a first dimension, a second one of the plurality of fillers has a second dimension greater than the first dimension, and the first one of the plurality of fillers is closer to the upper portion than the second one of the plurality of fillers is.

15. The electronic device of claim 13, further comprising:
a conductive layer extending from an upper surface of the conductive pillar, wherein a portion of the conductive layer is disposed over and spaced apart from the upper portion of the conductive pillar.

\* \* \* \* \*